(12) United States Patent
Detavernier et al.

(10) Patent No.: US 10,358,718 B2
(45) Date of Patent: Jul. 23, 2019

(54) METHODS FOR OBTAINING HYDROPHILIC FLUOROPOLYMERS

(71) Applicant: UNIVERSITEIT GENT, Ghent (BE)

(72) Inventors: Christophe Detavernier, Denderleeuw (BE); Davy Deduytsche, De Pinte (BE); Amit Kumar Roy, Thakurpur, Kolkata (IN)

(73) Assignee: UNIVERSITEIT GENT, Ghent (BE)

( * ) Notice: Subject to any disclaimer, the term of this patent is extended or adjusted under 35 U.S.C. 154(b) by 650 days.

(21) Appl. No.: 14/760,170

(22) PCT Filed: Jan. 16, 2014

(86) PCT No.: PCT/EP2014/050848
§ 371 (c)(1),
(2) Date: Jul. 9, 2015

(87) PCT Pub. No.: WO2014/111492
PCT Pub. Date: Jul. 24, 2014

(65) Prior Publication Data
US 2015/0345018 A1    Dec. 3, 2015

(30) Foreign Application Priority Data

Jan. 16, 2013  (EP) .................................... 13151432

(51) Int. Cl.
*C23C 16/02*    (2006.01)
*C23C 16/40*    (2006.01)
(Continued)

(52) U.S. Cl.
CPC ............ *C23C 16/403* (2013.01); *C23C 16/02* (2013.01); *C23C 16/40* (2013.01); *C23C 16/407* (2013.01);
(Continued)

(58) Field of Classification Search
CPC ....... C23C 16/403; C23C 16/02; C23C 16/40; C23C 16/407; C23C 16/45536; C23C 16/45555; C23C 16/52
See application file for complete search history.

(56) References Cited

U.S. PATENT DOCUMENTS

| | | | |
|---|---|---|---|
| 6,743,475 B2* | 6/2004 | Skarp | C23C 16/403 117/88 |
| 2003/0181329 A1* | 9/2003 | Tanaka | B01J 21/063 502/338 |
| 2015/0209198 A1* | 7/2015 | Aizenberg | A61L 29/06 604/378 |

OTHER PUBLICATIONS

Chen et al. Studies on the Surface Free Energy and Surface Structure of PTFE Film Treated with Low Temperature Plasma, J. App . Polymer Science, 1997, pp. 1733-1739. (Year: 1997).*

(Continued)

*Primary Examiner* — Kelly M Gambetta
(74) *Attorney, Agent, or Firm* — Workman Nydegger (57) ABSTRACT

A method is described for providing a hydrophilic effect to a fluoropolymer, e.g. polytetrafluoroethylene (PTFE) material. The method comprises obtaining an at least partly hydrophobic fluoropolymer material, applying a plasma and/or ozone activation step and depositing an inorganic coating using an atomic layer deposition process. Plasma activation step and/or said atomic layer deposition process thereby comprises using process parameters determining a high interaction probability between one or more precursors for the atomic layer deposition process and the fluoropolymer material so as to obtain a coated fluoropolymer material having a contact angle with water below 30°.

11 Claims, 4 Drawing Sheets

(51) Int. Cl.
*C23C 16/52* (2006.01)
*C23C 16/455* (2006.01)
(52) U.S. Cl.
CPC .. *C23C 16/45536* (2013.01); *C23C 16/45555* (2013.01); *C23C 16/52* (2013.01); *Y10T 428/31544* (2015.04)

(56) References Cited

OTHER PUBLICATIONS

Kemell et al. Surface modification of thermoplastics by atomic layer deposition of Al2O3 and TiO2 thin films, European Polymer Journal 44, 2008, pp. 3564-3570. (Year: 2008).*

Carbone, Emile A.D. et al., "How to Increase the Hydrophobicity of PTFE Surfaces Using an R.F. Atmospheric-Pressure Plasma Torch", Surface and Interface Analysis, vol. 42, Apr. 22, 2010, pp. 1014-1018. Retrieved from the Internet: URL:http://www.interscience.wiley.com/journal/sia.

Kemell, Marianna et al., "Surface Modification of Thermoplastics by Atomic Layer Deposition of Al2O3 and TiO2 Thin Films," European Polymer Journal, vol. 44, Sep. 11, 2008, pp. 3564-3570.

Musschoot, Jan, "Advantages and Challenges of Plasma Enhanced Atomic Layer Deposition", PhD of Jan Musschoot, Jan. 1, 2011, Universiteit Gent. Retrieved from the Internet: URL:http://www.cocoon.ugent.be/sites/default/files/phdtheses/PhD_JM.pdf.

Niskanen, Antti et al., "Low-Temperature Deposition of Aluminum Oxide by Radical Enhanced Atomic Layer Deposition", Journal of the Electrochemical Society, vol. 152, No. 7, Jun. 10, 2005, pp. f90-f93.

Sakai, Nobuyuki et al., "Quantitative Evaluation of the Photoinduced Hydrophilic Conversion Properties of TiO2 Thin Film Surfaces by the Reciprocal of Contact Angle", The Journal of Physical Chemistry B, vol. 107, No. 4, 2003, pp. 1028-1035.

Vandencasteele, Nicolas et al., "Study of Plasma Modified-PTFE for Biological Applications: Relationship Between Protein Resistant Properties, Plasma Treatment, Surface Composition and Surface Roughness", Plasma Processes and Polymers, Sep. 15, 2008, vol. 5, pp. 661-671.

International Search Report from corresponding PCT Application No. PCT/EP2014/050848, dated Jun. 12, 2014.

* cited by examiner

METHODS FOR OBTAINING HYDROPHILIC FLUOROPOLYMERS

FIELD OF THE INVENTION

The invention relates to the field of processing of thermoplastic materials. More particularly, the present invention relates to methods for rendering fluoropolymer material hydrophilic.

BACKGROUND OF THE INVENTION

Polytetrafluoroethylene (PTFE) is commercially known as Teflon which is one of the very useful thermostable and robust polymers. PTFE has several applications in various fields because it can sustain harsh environmental conditions. Typical applications of PTFE are known e.g. in corrosion resistant materials, cooking utensils, waterproof fabric, etc. Nevertheless, the use of polytetrafluoroethylene (PTFE) is restricted in various applications due to its chemical inertness and hydrophobic nature. For example, native porous PTFE is not suitable for water filtration membrane or leads to adhesion difficulties when used with other substrates such as metals, polymers and ceramic materials. Making PTFE hydrophilic would render PTFE more easily applicable.

For example, hydrophilic PTFE could be used as a water filtration membrane. Similarly, gluing or adhesion with other substrates could be improved, especially with other hydrophilic substrates. Consequently, hydrophilic PTFE will be suitable for attachment with other components (metal, polymers, and ceramic materials) for membrane support and other applications. In addition, after hydrophilic modification of PTFE, various functional coatings, such as for instance but not limited to metal coatings, can be deposited with ease which can lead to new directions of applications in the field of mechanics, optics, and electronics.

Some methods are known for achieving hydrophilic PTFE. In these known methods, hydrophilic PTFE is achieved by wet chemical methods which involve hazardous organic solvents, whereby long processing time is required to get rid of these solvents. Thus, these methods are time consuming and also involve chemical hazards. Other methods for obtaining hydrophilic PTFE are based on "growing" PTFE together with other hydrophilic polymer via copolymerization route.

It is known that one can obtain hydrophilic effects on polymers by plasma treatment, especially with oxygen plasma. Nevertheless, attempts to render native hydrophobic PTFE hydrophilic by applying oxygen plasma treatment did not succeed. Applying an oxygen plasma treatment renders PTFE more hydrophobic, as is for example described in Carbone et al. Surface Interface Anal. 2010 (42) 1014-1018 and Vandencasteele et al. Plasma Process. Polym. 2008 (5) 661.

In European Polymer Journal 44 (2008) p 3564-3570, Kemell et al. describe the use of thermal atomic layer deposition of $Al_2O_3$ and $TiO_2$ thin films on polymeric substrates such as PTFE for modifying their surface. In order to check the hydrophobic behavior of PTFE the water contact angle is studied and it is reported that the water contact angle decreases upon performing atomic layer deposition (ALD), but only down to 99°. In the study of Kemell et al. increasing the number of cycles thereby does not seem to allow to further reduce the water contact angle. In order to further decrease the contact angle, and thus render PTFE more hydrophilic, UV illumination was applied. UV induced hydrophilic effect suffers from aging effect. The effect vanishes with time as experienced by Sakai et al. J. Phys Chem B 2003 (107) 1028-1035. Furthermore, it was shown in Kemell et al. that the deposited thin films on PTFE did not pass the Scotch tape test, indicating poor adhesion properties of the deposited films.

Consequently, there is still a need for a good and efficient method for rendering PTFE hydrophilic.

SUMMARY OF THE INVENTION

It is an object of embodiments of the present invention to provide good methods for rendering fluoropolymers hydrophilic. It was surprisingly found that methods avoiding chemical hazards allow rendering fluoropolymer hydrophilic to water contact angles below 30°, advantageously a contact angle below 20°, more advantageously a contact angle below 10°.

It is an advantage of embodiments according to the present invention that methods can be provided for tuning the hydrophilic behavior of fluoropolymer, e.g. in a range down to contact angle below at least 30°, advantageously below 25°, more advantageously a contact angle in a range down to 20°, more advantageously a contact angle down to 10°.

It is an advantage of embodiments according to the present invention that the hydrophilic behavior of fluoropolymer substrates can be tuned, in the sense that the fluoropolymer substrates can be rendered hydrophilic in a selective manner, e.g. at one side of the substrate or only at a selected area of the substrate.

It is an advantage of embodiments according to the present invention that hydrophilic behavior of the material is obtained using a single process, i.e. by deposition of an inorganic coating, without the strict need for additional processing steps such as for example UV irradiation.

It is an advantage of embodiments according to the present invention that fluoropolymers such as e.g. PTFE can be rendered hydrophilic using soft conditions allowing to minimize sample damage, such as for example using processing at low temperature and/or at low plasma power.

It is an advantage of embodiments according to the present invention that methods and systems are provided that allow rendering fluoropolymer hydrophilic, applicable to both porous fluoropolymer as well as non-porous fluoropolymer with various size and shape.

It is an advantage of embodiments according to the present invention that for porous fluoropolymer, hydrophilic properties can be obtained using coating of fluoropolymer whereby furthermore good adhesion properties of the coating on fluoropolymer are obtained.

It is an advantage of embodiments according to the present invention that thickness and conformity of the deposited coating on fluoropolymer can be well controlled. It is an advantage of embodiments according to the present invention that pore size of porous fluoropolymer can be controlled by controlling the thickness of the coating on the fluoropolymer material.

It is an advantage of embodiments of the present invention that the hydrophilic tuning and/or obtaining a full hydrophilic fluoropolymer material can be obtained using only atomic layer deposition and does not require additional steps for rendering the fluoropolymer material more hydrophilic, such as e.g. UV illumination and/or wet chemical processing steps.

It is an advantage of embodiments of the present invention that methods are provided that allow rendering fluoropolymer material permanently hydrophilic.

The above objective is accomplished by a method and device according to the present invention.

The present invention relates to a method for providing a hydrophilic effect to a fluoropolymer material, the method comprising obtaining an at least partly hydrophobic fluoropolymer material, applying a plasma and/or ozon activation step and depositing an inorganic coating using an atomic layer deposition process, so as to obtain an inorganic coated fluoropolymer material having a contact angle with water below 30°, advantageously below 20°, more advantageously below 10°. In some embodiments, a method is described for providing a hydrophilic effect to a fluoropolymer material, the method comprising obtaining an at least partly hydrophobic fluoropolymer material, applying a plasma and/or ozon activation step and depositing an inorganic coating using an atomic layer deposition process, wherein using said atomic layer deposition process and/or applying a plasma and/or ozon activation step comprises using process parameters for said plasma and/or ozon activation step and for said the atomic layer deposition process determining a high interaction probability between one or more precursors for the atomic layer deposition process and the fluoropolymer material so as to obtain an inorganic coated fluoropolymer material having a contact angle with water below 30°, advantageously below 20°, more advantageously below 10°.

Obtaining an at least partly hydrophobic fluoropolymer material may comprise obtaining a porous fluoropolymer membrane.

The inorganic coating may be an inorganic oxide coating.

Depositing an inorganic material may comprise (but is not limited to) depositing an inorganic oxide, e.g. a coating of $Al_2O_3$, $ZnO$, $SiO_2$, $CaO$, $TiO_2$, $V_2O_5$, $V_2O_3$, $FeO_2$, $Fe_3O_4$, $P_2O_5$, $MnO$, $ZrO_2$, $MgO$, $SnO_2$, $AlPO_4$, $Zn_3(PO_4)_2$ or $Ca_3(PO_4)_2$.

The fluoropolymer material may have at least two regions, and said depositing an inorganic oxide coating may be performed only to one of said at least two regions. Said depositing may comprise depositing the inorganic oxide only at one side of the fluoropolymer material.

Using particular process parameters may comprise applying a plasma-enhanced atomic layer deposition process. In this case the plasma activation step may be performed simultaneously with the atomic layer deposition.

Applying a plasma-enhanced atomic layer deposition process may comprise performing an oxygen plasma treatment step during the atomic layer deposition.

Using process parameters for the atomic layer deposition process may comprise applying an atomic layer deposition process having a number of cycles of the atomic layer deposition large enough to provide an inorganic oxide coated fluoropolymer material having a contact angle with water below 30°, advantageously below 20°, is obtained.

The method furthermore may comprise, before said depositing an inorganic material, applying an ozone based process to obtained at least a partly hydrophobic fluoropolymer material. In other words, using process parameters may comprise applying an exposure to ozone prior or during the atomic layer deposition process. Using process parameters may comprise applying a chemical modification process of the surface.

Obtaining at least a partly hydrophobic fluoropolymer material may comprise obtaining at least a partly hydrophobic polytetrafluoroethylene (PTFE) material.

In some embodiments, the deposited coating may be a metal coating instead of an inorganic oxide coating. The metal coating may be a platinum coating.

The present invention also relates to a method for tuning a degree of hydrophilicity of a fluoropolymer material, the method comprising obtaining at least a partly hydrophobic fluoropolymer material, selecting at least one process parameter for applying a plasma activation step and/or for deposition of an inorganic oxide coating on the fluoropolymer material using an atomic layer deposition process, wherein said selecting is based on correlation data providing a correlation between at least one process parameter and a degree of hydrophilicity of an inorganic oxide coated fluoropolymer material, the correlation data comprising data for a degree of hydrophilicity corresponding with an inorganic oxide coated fluoropolymer material comprising a contact angle with water below 30°, advantageously below 20°, more advantageously below 10°, and applying a plasma activation step and/or depositing an inorganic oxide coating by applying an atomic layer deposition process using at least one selected process parameter.

The present invention also relates to a product having hydrophilic properties, the product comprising a hydrophilic fluoropolymer material obtained using a method as described above.

The present invention furthermore relates to a product having hydrophilic properties, the product comprising at least a fluoropolymer material, wherein the fluoropolymer material is coated with an inorganic material, the coated fluoropolymer material having a water contact angle with water being smaller than 30°, advantageously a water contact angle with water being smaller than 20°, more advantageously smaller than 10°. The fluoropolymer material may be polytetrafluoroethylene (PTFE) material. The inorganic material may be a metal oxide.

In one aspect, the present invention furthermore relates to a method for providing a coating to a fluoropolymer material, the method comprising obtaining a fluoropolymer material, in some embodiments being an at least partly hydrophobic fluoropolymer material, applying a plasma activation step and depositing an inorganic material coating using an atomic layer deposition process.

The material may be a metal such as platinum. The fluoropolymer material may be PTFE. The fluoropolymer material may be porous. Process parameters of the atomic layer deposition process may be selected that determine a high interaction probability between the one or more precursors for the atomic layer deposition process and the fluoropolymer material.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It is understood that embodiments of the invention may be practiced without specific details disclosed below. Furthermore, well-known methods, structures and techniques have not been shown in detail in order not to obscure an understanding of this description.

Where in embodiments of the present invention reference is made to "porous fluoropolymer", reference is made to fluoropolymer material that is a membrane comprising pores having an average diameter e.g. in a range of 50 nm to 10 mm. Some or all of the pores may extend in two or three dimensions. Where reference is made to an average diameter of a pore, reference may be made to mean flow pore size, which may be determined based on the bubble point test. For the bubble point test, the layer is saturated and the first bubble that passes the membrane at a given pressure is linked to the largest pore. By changing the pressure and evaluating the air passage, the pore size distribution is determined. From the pore size distribution, the average flow pore size is determined. This method may be used as characterisation method in embodiments of the present invention.

Where in embodiments of the present invention reference is made to "hard fluoropolymer" or "non-porous fluoropolymer" reference is made to fluoropolymer material that does not comprise a substantial amount of pores having an average diameter of more than 50 nm, or advantageously is even pore free.

Where in embodiments of the present invention reference is made to hydrophobicity respectively hydrophilicity, reference is made to the degree wherein materials behave as hydrophobic respectively hydrophilic materials. As the present invention is not restricted to interaction with water but more generally to interaction with liquids, the scope of the invention extends similarly to methods and systems for rendering materials lyophilic.

Where in embodiments of the present invention reference is made to a permanent hydrophilic state, reference is made to a state wherein a product is at least stable hydrophilic for more than one year.

In a first aspect, the present invention relates to a method for providing a hydrophilic effect to a fluoropolymer material. Particular examples of a fluoropolymer material comprise polytetrafluoroethylene (PTFE) material or a material comprising polytetrafluoroethylene, but also ethylenetetrafluoroethylene (ETFE), perfluoroalkoxy (PFA) or fluorinated ethylene propylene (FEP). Such a material typically may be at least partly hydrophobic. For establishing a degree of hydrophobicity or hydrophilicity, typically use may be made of a measurement of the contact angle between a surface of a substrate and water, e.g. a water drop. In embodiments of the present invention, typically reference may be made to hydrophilic materials if a water contact angle between water and the fluoropolymer material is present of less than 30°. Other materials are called at least partly hydrophobic. Materials are referred to as superhydrophilic if a water contact angle between water and the fluoropolymer material is present of less than 10°. Hydrophobicity could be defined as materials having a water contact angle of 90° or larger.

The method according to embodiments of the present invention comprises obtaining an at least partly hydrophobic fluoropolymer material. The method furthermore comprises applying a plasma activation and/or ozon activation step and depositing an inorganic coating material, e.g. a metal oxide coating. The plasma activation step may be performed prior or simultaneously with the deposition step.

Depositing an inorganic coating may for example be depositing any suitable inorganic oxide coating, e.g. an inorganic oxide coating having hydrophilic properties. The inorganic oxide coating may in particular examples be a zinc oxide layer, an aluminum oxide layer, $SiO_2$, CaO, $TiO_2$, $V_2O_5$, $V_2O_3$, $FeO_2$, $Fe_3O_4$, $P_2O_5$, MnO, $ZrO_2$, MgO, $SnO_2$, $AlPO_4$, $Zn_3(PO_4)_2$ or $Ca_3(PO_4)_2$ although embodiments are not limited thereto. According to embodiments of the present invention, the inorganic coating is deposited using an atomic layer deposition technique, whereby process parameters for the atomic layer deposition process are used resulting in a high interaction probability between one or more precursors for the atomic layer deposition process and the fluoropolymer material so as to obtain an inorganic oxide coated fluoropolymer material having a contact angle with water below 30°, advantageously below 20°, more advantageously below 10°.

An atomic layer deposition technique is a sequential chemical vapor deposition technique in which substrates are exposed to two (or more) precursors in a sequential manner. The materials used for atomic layer deposition and provided during the different cycles are typically referred to as precursors for the process.

According to embodiments of the present invention process parameters of the atomic layer deposition and/or process parameters of the plasma and/or ozon activation step are used that result in a high interaction probability between one or more precursors for the atomic layer deposition process and the fluoropolymer material. The latter can for example be by providing a longer interaction time between the one or more precursors and the fluoropolymer material or be by making the fluoropolymer material more receptive for binding with one or more precursors. Typical parameters that could be used for this are the number of cycles used, the precursor flow rate, the gas pressure in which the interaction occurs, process parameters determining the plasma and/or ozon activation step, which may be a plasma exposure step, such as power, gas type, etc, and the temperature or a combination thereof. In one embodiment, the process parameter exposure may be selected in the range $10^4$ to $10^{12}$ L, advantageously in the range $10^5$ to $10^{12}$ L, such as for example in the range $10^5$ to $10^7$ L. The exposure thereby is expressed in Langmuir, corresponding with $10^{-6}$ torr.second. One or more of these parameters may be particularly selected for use such that a metal oxide coated fluoropolymer material is obtained having a water contact angle with water below 30°, advantageously below 25°, more advantageously below 20°.

According to embodiments of the present invention, the fluoropolymer material advantageously may be a porous fluoropolymer membrane, as the latter assists in obtaining a better adhesion of the inorganic coating to the fluoropolymer material. Nevertheless, the fluoropolymer material is not restricted to a membrane, but may be any other type of substrate, such as for example a fluoropolymer sheet, a fluoropolymer block, etc.

In an embodiment of the present invention, applying an inorganic coating to the fluoropolymer material may comprise selectively coating an inorganic coating, e.g. inorganic oxide coating to the fluoropolymer material, e.g. on one side of a fluoropolymer material substrate or at both sides of a fluoropolymer material substrate. More generally, the fluoropolymer material may comprise at least two regions, wherein one of the regions is coated with an inorganic material and another region is not coated with an inorganic material. The substrate thereby may be sheet or weblike. Selectively coating also may be performed to only parts of one or more sides of the material.

According to an embodiment of the present invention, the method may comprise controlling the degree of hydrophobicity by controlling the ALD process used for applying the inorganic coating to the fluoropolymer material. Controlling the ALD process thereby may for example comprise controlling the number of deposition cycles applied in the ALD process. As will be shown in the experimental results, the water contact angle, which is used as a measure for hydrophobicity, alternatively or in addition thereto, the degree of hydrophobicity may also be controlled by controlling the temperature at which the ALD process is applied, or, if plasma enhanced ALD is used, a plasma parameter, such as for example plasma power, gas pressure, . . . .

In a particular embodiment, a method as described in an embodiment as described above is applied, whereby one or more additional steps are performed for increasing the adhesion properties of the inorganic oxide layer on the fluoropolymer material. Such an embodiment may be especially suitable for hard fluoropolymer sheets that suffer more from adhesion problems than porous fluoropolymer materials. Examples of such one or more steps include plasma treatment prior or during fluoropolymer deposition such as for example long oxygen plasma treatment at high power, chemical treatment prior to ALD depositions, such as for example $CF_4$ plasma treatment, etc. Where reference is made to long treatment, reference may be made to treatment up to 12 h. Where reference is made to high power, reference may be made to a power ranging from 25 W to 600 W.

Another example is the application of an exposure to ozone, which can be performed prior ALD deposition as a pretreatment or during ALD deposition.

More generally, processing for chemical modification, such as plasma treatment or ozone treatment may be applied and are especially suitable when hard fluoropolymer materials are to be rendered hydrophilic.

Particular examples, illustrating materials and conditions that can according to some particular embodiments be used, are described in more detail below in the description.

In a second aspect, the present invention also relates to a method for tuning a degree of hydrophilicity of a fluoropolymer material, such as for example a polytetrafluoroethylene (PTFE) material. The method according to embodiments of the present invention comprises obtaining an at least partly hydrophobic fluoropolymer material, similar as described in the first aspect. The method furthermore comprises selecting at least one process parameter for applying a plasma activation step and/or deposition of an inorganic coating on the fluoropolymer material using an atomic layer deposition process, wherein said selecting is based on correlation data providing a correlation between the at least one process parameter and a degree of hydrophilicity of an inorganic oxide coated fluoropolymer material. The correlation data thereby comprise data for a degree of hydrophilicity corresponding with an inorganic oxide coated fluoropolymer material comprising a contact angle with water below 30°, advantageously below 25°, more advantageously below 20°. Such correlation data may for example be a functional relationship, look up table, mathematical relationship, or a set of other data between one or more process parameters and a water contact angle of an inorganic oxide coated fluoropolymer material or a parameter related to a degree of hydrophilicity or hydrophobicity. Such correlation data may be determined based on a number of calibration experiments, based on previously obtained results, based on mathematical calculations, etc.

The method furthermore comprises applying the plasma activation step and/or depositing an inorganic coating by applying an atomic layer deposition process using said selected at least one process parameter. Further features and advantages may be as described for the first aspect.

In still another aspect, the present invention also relates to a product having hydrophilic properties, the product comprising at least a fluoropolymer material, wherein the fluoropolymer material is coated with an inorganic oxide, the coated fluoropolymer material having a water contact angle with water being smaller than 30°, advantageously, smaller than 25°, more advantageously being smaller than 20°. Such products may for example be made using a method as described in any of the first or second aspect. According to a particular embodiment, the fluoropolymer material may be porous. Further according to embodiments of the present invention, the thickness of the coating deposited on the fluoropolymer material may substantially define the pore size. Particular examples of products may comprise e.g. a fluoropolymer material coated with a metal oxide, such as e.g. zinc oxide or aluminum oxide, $SiO_2$, CaO, $TiO_2$, $V_2O_5$, $V_2O_3$, $FeO_2$, $Fe_3O_4$, $P_2O_5$, MnO, $ZrO_2$, MgO, $SnO_2$, $AlPO_4$, $Zn_3(PO_4)_2$ or $Ca_3(PO_4)_2$, the coatings being made using atomic layer deposition. Particular examples of fabrication processes are described by examples 1 to 4 and 6 to 8.

By way of illustration experimental results obtained using a method according to embodiments of the present invention are reported, the invention not being limited thereby.

Figure 1:
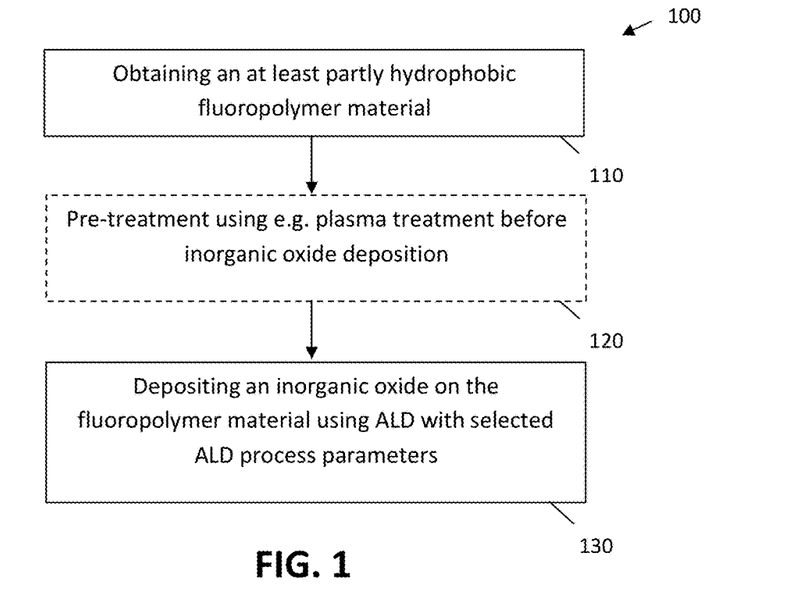
FIG. 1 illustrates an exemplary method for making a fluoropolymer material hydrophilic according to an embodiment of the present invention.
Figure 2:
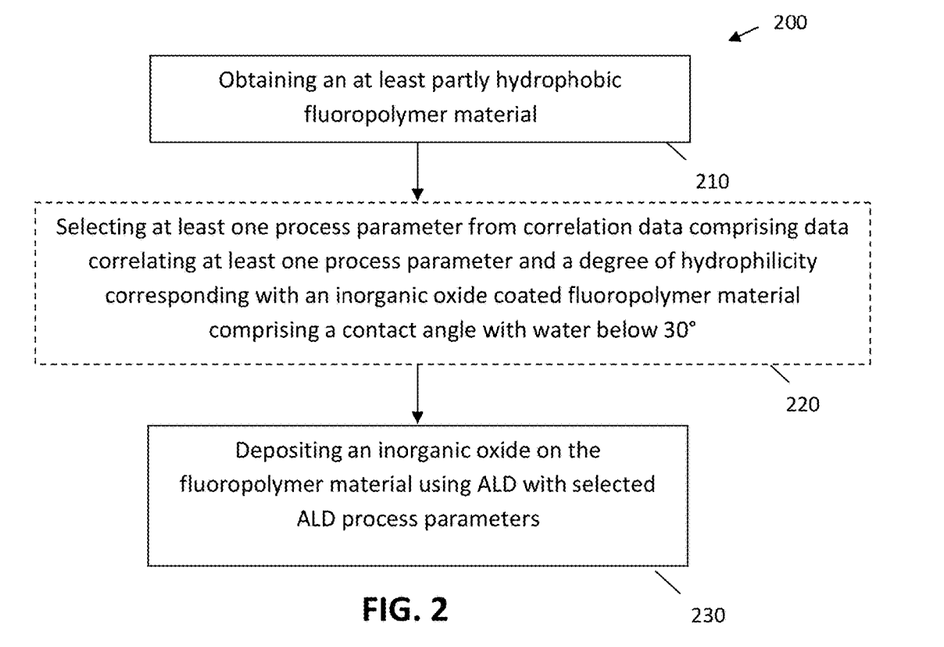
FIG. 2 illustrates an exemplary method for controlling the hydrophobicity of a fluoropolymer material according to an embodiment of the present invention.
Figure 3:
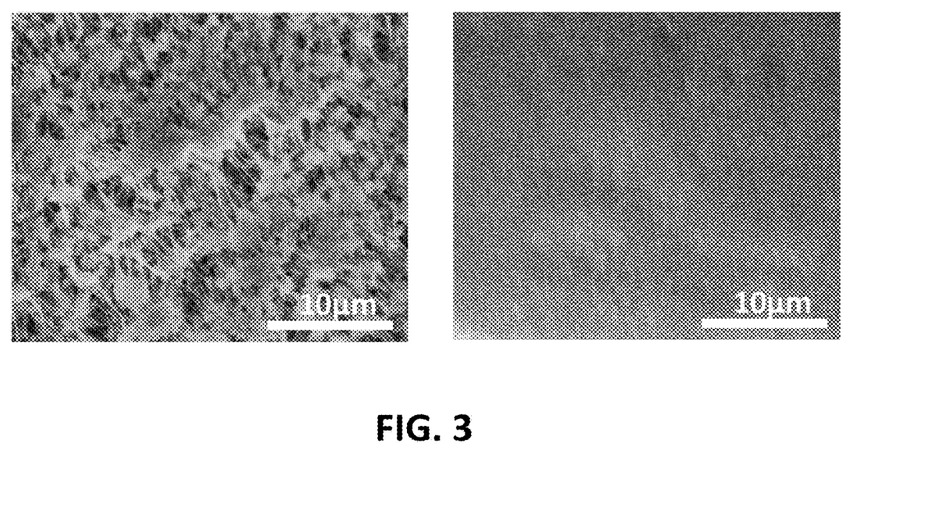
FIG. 3 illustrates different types of PTFE substrates that are used in exemplary methods according to embodiments of the present invention for rendering the PTFE substrates hydrophilic.

Two different fluoropolymer materials were used, a first being a porous PTFE membrane and a second being a hard PTFE sheet. By way of illustration, scanning electron microscope images are shown of the porous PTFE membrane and the hard PTFE sheet in FIG. 3. The porous PTFE can be seen on the left hand side, the hard PTFE can be seen on the right hand side, whereby the hard PTFE has a continuous, uniform layer structure. For the atomic layer deposition process, the following chemicals were used in the different examples: trimethylaluminum (Aldrich, 97%), deionised water, diethylzinc (Stem Chemicals, 95%). The effective pressure in the reactor of trimethylaluminum, diethylzinc, water, oxygen and ozone pulses were 0.5 Pa, 0.4 Pa, 0.3 Pa, 0.3 Pa and 0.2 Pa respectively. In the experiments discussed below, aluminum oxide and zinc oxide have been deposited onto Polytetrafluoroethylene (PTFE) via thermal and plasma enhanced atomic layer depositions.

Experiment 1

Aluminum oxide was deposited using thermal atomic layer deposition on a PTFE membrane. Thermal aluminum oxide has been deposited on PTFE by exposing the polymer to pulses of trimethylalumium (TMA) and water. The thermal depositions have been carried out at temperatures between 65° C. to 100° C. and one cycle of the process can be described as follows: A trimethylaluminum pulse with a pulse length of 2 s was applied to the PTFE material that was exposed to the pulse for 10 s. Thereafter, the remaining vapour was removed by pumping during 60 s. Following the pumping, a water vapour pulse was applied for 2 s and the PTFE material was exposed 10 s to the water vapour. For removing the water vapour, thereafter again 60 s of pumping was applied. Samples were studied for different numbers of aluminum oxide ALD deposition cycles, in the present example in the range 0 to 350 cycles. During precursor pulses, typical gas pressure inside the chamber is between $10^{-1}$ to $10^{-2}$ mbar (0.075 to 0.0075 Ton). The precursor exposure amounts to approximately $10^5$ L to $10^6$ L.

Experiment 2

Aluminum oxide was deposited using plasma enhanced atomic layer deposition on a PTFE membrane. For the plasma enhanced atomic layer deposition of aluminum oxide a cycle of the process can be described as follows: A trimethylaluminum pulse with a pulse length of 2 s was applied to the PTFE material that was exposed to the pulse for 10 s. Thereafter, the remaining vapour was removed by pumping during 60 s. Following the pumping, an oxygen plasma treatment was applied during 6 s, followed by 30 s of pumping. The plasma power varied between 25W and 300W. Samples were studied for different numbers of aluminum oxide ALD deposition cycles, in the present example in the range 0 to 75 cycles. During precursor pulses, typical gas pressure inside the chamber is between $10^{-1}$ to $10^{-2}$ mbar (0.075 to 0.0075 Ton). Precursor exposure amounts to approximately $10^5$ L to $10^6$ L.

Experiment 3

Zinc oxide was deposited using thermal atomic layer deposition on a PTFE membrane. For thermal zinc oxide deposition diethylzinc(DEZn) and water have been used. The thermal atomic layer deposition of zinc oxide was performed at a temperature between 65° C. and 100° C. and one cycle of the process can be described as follows: A diethylzinc pulse with a pulse length of 2 s was applied to the PTFE material that was exposed to the pulse for 10 s. Thereafter, the remaining material was removed by pumping during 60 s. Following the pumping, a water vapour pulse was applied for 2 s and the PTFE material was exposed 10 s to the water vapour. For removing the water vapour, thereafter again 60 s of pumping was applied. Samples were studied for different numbers of zinc oxide ALD deposition cycles, in the present example in the range 0 to 400 cycles. During precursor pulses, typical gas pressure inside the chamber is between $10^{-1}$ to $10^{-2}$ mbar (0.075 to 0.0075 Ton). The precursor exposure amounts to approximately $10^5$ L to $10^6$ L.

Experiment 4

Zinc oxide was deposited using plasma enhanced atomic layer deposition on a PTFE membrane. For the plasma enhanced atomic layer deposition of zinc oxide, one cycle of the process can be described as follows: A diethylzinc pulse with a pulse length of 2 s was applied to the PTFE material that was exposed to the pulse for 10 s. Thereafter, the remaining material was removed by pumping during 60 s. Following the pumping, an oxygen plasma treatment was applied during 6 s, followed by 30 s of pumping. The plasma power varied between 25W and 300W. Samples were studied for different numbers of zinc oxide ALD deposition cycles, in the present example in the range 0 to 250 cycles. During precursor pulses, typical gas pressure inside the chamber is between $10^{-1}$ to $10^{-2}$ mbar (0.075 to 0.0075 Torr). Precursor exposure amounts to approximately $10^5$ L to $10^6$ L.

Experiment 5

By way of comparison, mere oxygen plasma treatment without ALD deposition also was performed. The number of cycles used was in the range 0 to 250 cycles. One cycle thereby consisted of a plasma treatment that was applied for 6 s, followed by 30 s of pumping.

Experiment 6

The experiments described in experiments 1 to 4 were also performed on a hard PTFE material sheet.

Experiment 7

ALD deposition of alumina on hard PTFE material sheet was also performed, after the hard PTFE material sheet was pretreated using a $CF_4$ plasma treatment.

Experiment 8

Aluminum oxide was deposited via thermal atomic layer deposition using trimethylaluminum and ozone at 100° C.: A trimethylaluminum pulse with a pulse length of 5 s was applied to the PTFE material that was exposed to the pulse for 13 s. Thereafter, the remaining vapour was removed by pumping during 15 s. Following the pumping, an ozone pulse was applied for 5 s and the PTFE material was exposed for 13 s to the ozone. For removing the ozone gas, thereafter again 15 s of pumping was applied. Samples were studied for different numbers of aluminum oxide ALD cycles, in the present example in the range 0 to 400 cycles.

Experiment 9

Platinum metal was deposited on Polytetrafluoroethylene (PTFE) via thermal atomic layer deposition (ALD) using methylcyclopentadienyl(trimethyl) platinum and ozone as precursors at 200° C. A methylcyclopentadienyl(trimethyl) platinum precursor pulse with a pulse length of 5 s was applied to the PTFE material that was exposed to the pulse for 20 s. Thereafter, the remaining material was removed by pumping during 50 s. Following the pumping, an ozone gas pulse was applied for 3 s and the PTFE material was exposed for 10 s to the ozone. For removing the ozone gas, thereafter again 50 s of pumping was applied. A series of samples were prepared with different number of ALD cycles.

Characterisation of the different materials obtained in the experiments described above included SEM, EDX and XRF. Scanning electron microscopy (SEM) and energy dispersive X-ray spectroscopy (EDX) are carried out with a FEI Quanta 200 FEG-SEM. X-ray florescence (XRF) measurements are done using a Bruker AXS instrument. After aluminum oxide deposition specimens are characterized via energy dispersive X-ray (EDX) spectroscopy and after zinc oxide deposition via X-ray fluorescence (XRF) spectroscopy. In case of thermal ALD of both aluminum and zinc oxides, oxide deposition only started after some nucleation delay, on the other hand, PEALD started almost from the initial stage of the deposition process.

In order to study the hydrophilicity of the coated materials, the water contact angle was studied for water on the metal oxide coated PTFE membrane as formed in experiments 1 to 4. Water contact angles have been measured by using a device from Advex instruments. Contact angles have been measured using water droplets of a volume of 10 μl.

Figure 4:
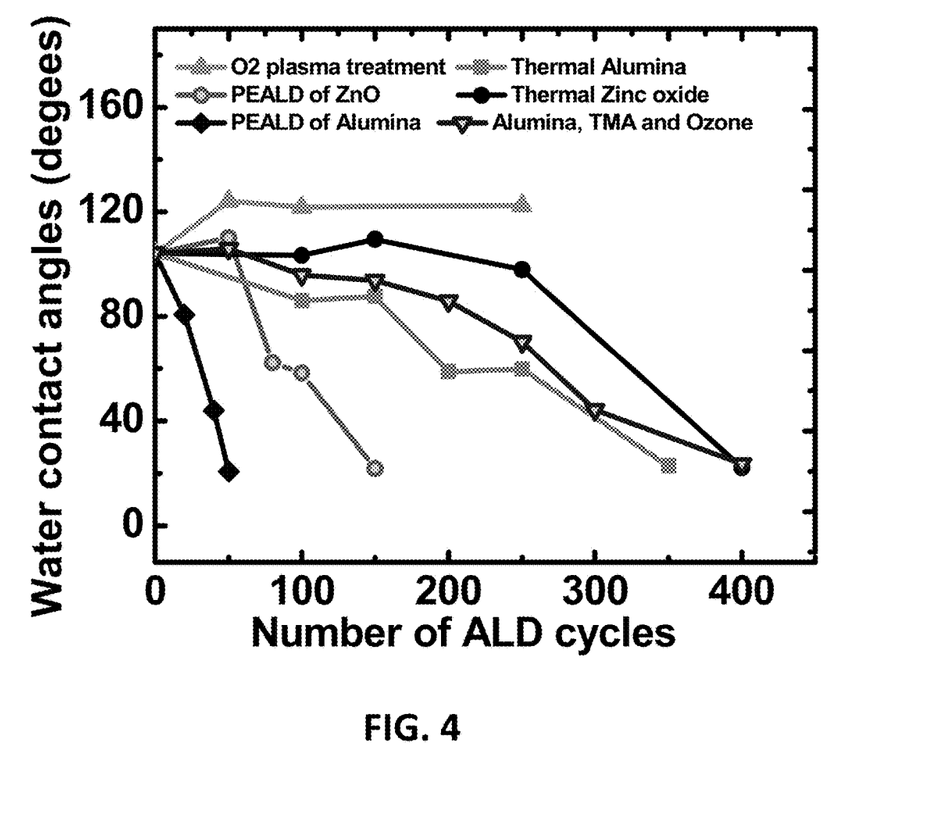
FIG. 4 shows the water contact angle as function of the number of cycles of ALD deposition for $Al_2O_3$ and ZnO on a PTFE membrane, using a method according to an embodiment of the present invention.

Such a water contact angle is an indication of the degree of hydrophilicity that is obtained. Water contact angles as a function of number of cycles are presented in FIG. 4. In case of native PTFE, the measured water contact angle is approximately 105° as known from literature. This changed to a complete hydrophilic state (wherein the contact angle is smaller than 10°, advantageously the contact angle being 0°) after 350 cycles of metal oxide depositions. If the PTFE samples are treated with only oxygen plasma, especially with higher plasma power (such as 300 W), the water contact angle increases compared to native samples, illustrating that the hydrophilic effect is not related to the oxygen plasma as such. On the other hand, if these samples are treated with TMA and oxygen plasma in a sequential manner (i.e., PEALD of aluminum oxide), the water contact angle is decreased to below 10°, advantageously to zero already after 50 cycles of deposition. PEALD has a better hydrophilic effect compared to thermal ALD. This may be related to steady deposition of aluminum oxide from the first cycle. Another reason may be that PEALD deposits thicker films compared to thermal ALD. For example, on flat silica substrates, the average deposition rate of thermal ALD is about 0.1 nm/cycle, but PEALD has a deposition rate of about 0.14 nm/cycle.

Deposition characteristics of thermal and plasma enhanced ALD of zinc oxide on PTFE porous membrane are similar to the corresponding aluminum oxide deposition characteristics. For example, thermal ALD of zinc oxide is also delayed like thermal aluminum oxide deposition but on the other hand plasma enhanced zinc oxide started deposition from the initial stage of the process. Wetting behavior of the PTFE porous membrane after zinc oxide deposition is presented in FIG. 4. In case of thermal zinc oxide after 400 cycles of deposition, hydrophobic PTFE porous sheet turned to hydrophilic. PEALD of zinc oxide can also make it hydrophilic after 150 cycles of deposition. PEALD is more effective to induce a hydrophilic effect on PTFE compared to the thermal process for both aluminum and zinc oxides deposition.

From these results, it can be seen that in case of both aluminum and zinc oxides deposition, plasma enhanced ALD is more effective than the thermal process.

Figure 5:
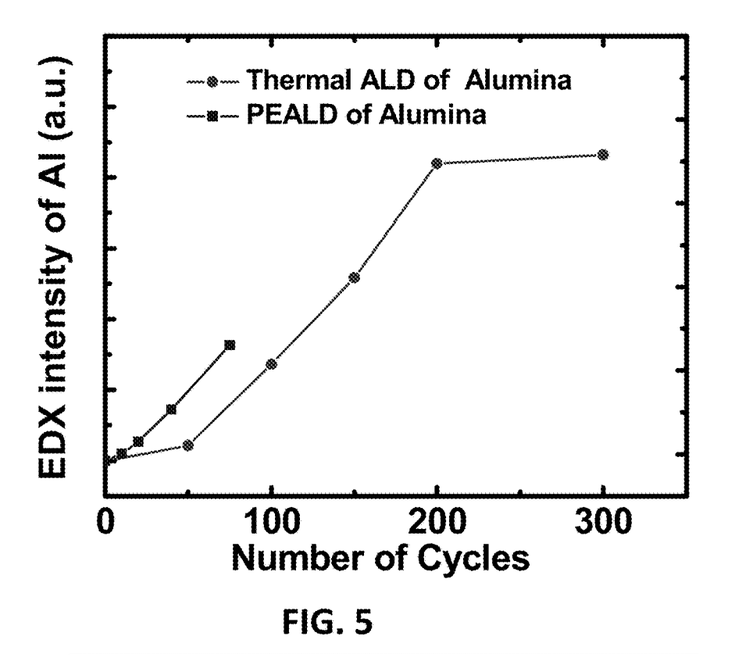
FIG. 5 shows EDX results for an $Al_2O_3$ ALD deposition on PTFE as function of the number of cycles of ALD deposition performed, illustrating features of embodiments of the present invention.
Figure 6:
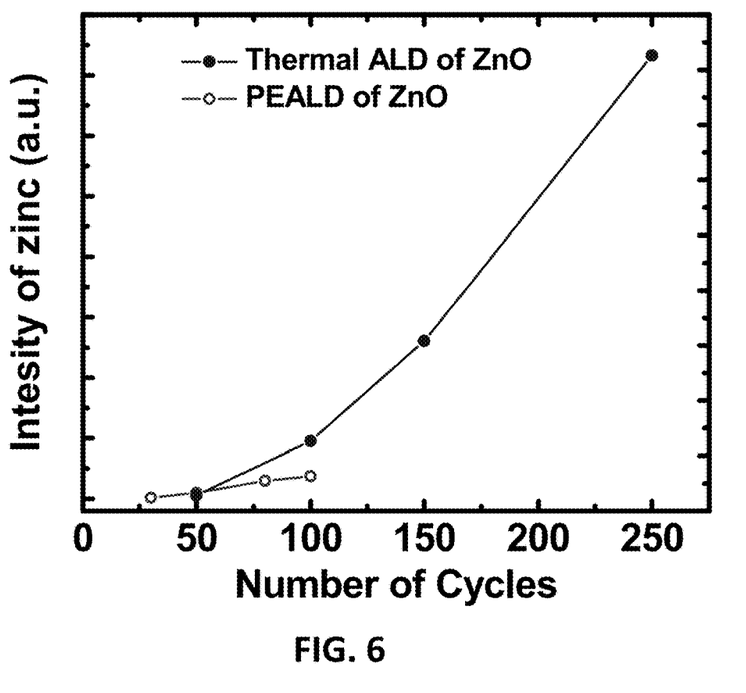
FIG. 6 shows XRF results for ZnO ALD deposition on PTFE as function of the number of cycles of ALD deposition performed, illustrating features of embodiments of the present invention.

After aluminum oxide depositions on hard polytetrafluoroethylene (PTFE) sheets, all samples are characterized by EDX. The aluminum intensity on PTFE as a function of the number of deposition cycles is presented in FIG. 5. During thermal ALD, the actual aluminum oxide deposition only starts after a certain number of cycles (around 50 cycles). These results indicate that the thermal deposition using water as a precursor requires a nucleation period before actual oxide deposition starts. One of the reasons for such a nucleation period may be the absence of surface functional group (like —OH or —$NH_2$) on PTFE. Another reason may be because of the hydrophobic nature of the surface which prevents the adsorptions of precursors, especially of water molecules, thus prolonging the nucleation period before starting actual depositions. On the other hand, for plasma enhanced processes the deposition starts from the initial stage which indicates that oxygen plasma activates the PTFE surface and facilitated the depositions. FIG. 6 illustrates corresponding results based on X-ray fluorescence characterisation of Zinc Oxide on the PTFE material, also indicating that the initial growth rate of both oxides is larger for the plasma enhanced processes. The latter can be seen in FIG. 5 and FIG. 6.

Furthermore, comparison is made with a PTFE material that was subject to an oxygen plasma treatment without ALD deposition, in which case the hydrophobicity increased.

From experiment 6 it could be derived that hydrophilic effects also could be obtained when hard PTFE material sheets were used as a substrate. EDX analysis has learned that corresponding metal peaks occur after depositions on hard teflon. It was equally found that the water contact angle decreases compared to the native PTFE sheet. However, the coatings are removed during a scotch tape test. To improve the adhesion of the deposited metal oxide, the hard PTFE surface can e.g. be modified prior to the ALD deposition. Layers of porous polytetrafluoroethylene deposited on the hard sheet via chemical vapor deposition (CVD) could for example improve the adhesion. PEALD of alumina carried out on the modified PTFE sheet learns that, after 400 cycles of deposition, the water contact angle can be reduced to about 60°. Simultaneously, one can spread water droplets on the sheet surface which is also an indication of hydrophilic nature of the flat substrates. The water contact angle may also be reduced further if a more appropriate chemical modification of the material can be obtained, e.g. a more homogeneous chemical modification. Nevertheless, it is to be noticed that already in the present examples the modified PTFE sheets are still hydrophilic after twisting, bending, and scotch tape experiments which indicates that the oxides are well adhered to the surface of the PTFE.

Figure 7:
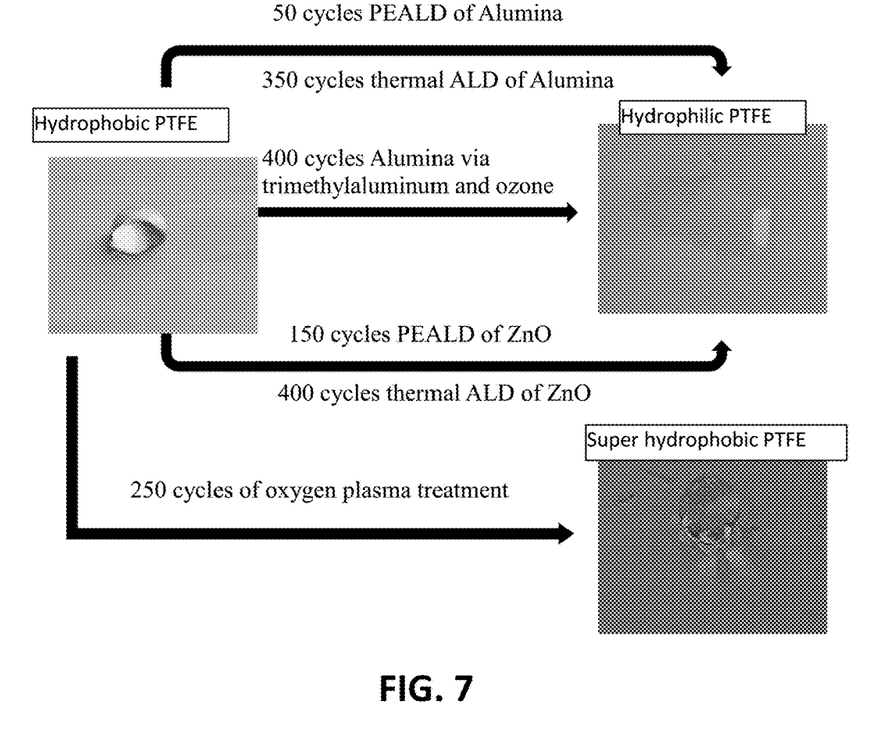
FIG. 7 illustrates an overview of experimental results obtained using embodiments according to the present invention.

An overview of the experimental results and the hydrophilic effect obtained is shown in FIG. 7. The surprising effect that complete hydrophilic PTFE materials can be obtained by only coating them with a metal oxide using ALD illustrates advantages of embodiments of the present invention.

Without wishing to be bound by theory, it is believed that using ALD under conditions providing a sufficiently high interaction probability of the precursors in the ALD process and the PTFE material, e.g. with a sufficient number of cycles thus lengthening the time for possible interaction between the precursors in the ALD process and the PTFE material, and/or e.g. in combination with plasma enhancement, which increases the interaction probability by rendering the PTFE material more receptive for interaction with the precursors in the ALD process, a sufficiently high degree of coverage of the PFTE material with metal oxide material can be obtained so that the PFTE material behaves fully hydrophilic.

It was advantageously found that the effect obtained using a method according to an embodiment of the present invention was a permanent effect. In other words, the effect obtained is stable over time.

As indicated above, plasma enhanced ALD with appropriate effects can be already performed at a power as low as 25 W, which can assure limited or no plasma damage.

As indicated above, it is an advantage of embodiments of the present invention that it can be accurately controlled to make one or both sides of a PTFE substrate or even only certain positions on a substrate hydrophilic. Furthermore, it is also an advantage of embodiments of the present invention that the degree of hydrophobicity can be controlled.

The hydrophilic PTFE material obtained using a method as described above, can advantageously be used in a variety of applications, some of these applications exemplified below.

Hydrophilic PTFE membranes can be used for water filtration applications. By controlling the thickness of the inorganic oxide coating on the PTFE membrane or by controlling the thickness of an additional coating on the inorganic oxide coating, the pore size of the membranes can be selectively chosen, thus allowing filtration in particular particle size ranges.

Hydrophilic PTFE materials have the property of being sticky, rendering these materials suitable such as adhesion of human endothelial cells improves on hydrophilic PTFE substrate which facilitate growth on such substrate. In this way, PTFE can e.g. be used in medical applications.

Hydrophilic PTFE materials can be chemically active, thus rendering them useful for functional coating depositions, such as for example in catalysis, as electrodes for batteries or fuel cells, etc.

Figure 8:
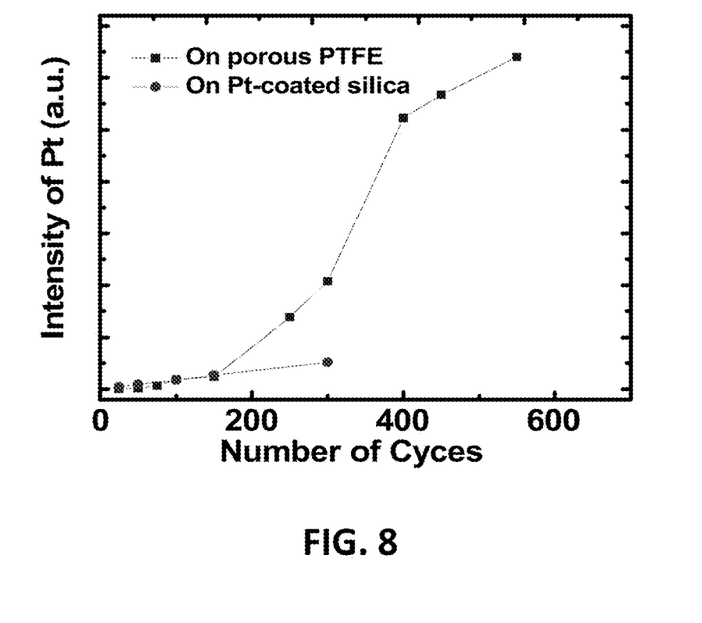
FIG. 8 illustrates the number of Pt XRF counts as a function of number of ALD cycles for Pt deposition according to an embodiment of the present invention.

A metal coating may for example be deposited on the hydrophilic PTFE, either directly or onto the inorganic oxide coating. The metal coating may for instance be a Pt coating, as illustrated in experiment 9. The deposition of the Pt coating, illustrated in experiment 9, is evaluated using XRF measurements on the entire set of samples. From the study of the XRF intensity of the samples, a nucleation delay of 25 cycles could be noticed. Pt XRF counts as a function of number of ALD cycles are presented in FIG. 8.

Hydrophilic PTFE materials can be used in harsh environments. By implementing it as a polymer-ceramic composite, use can be made of its high tensile strength and toughness. Furthermore it may act as a good thermal barrier coating, thus being useful in high temperature applications, or as a barrier for gas diffusion.

In one aspect, the present invention furthermore relates to a method for providing a metal coating directly to a fluoropolymer material, such as for example PTFE. The method thereby comprises obtaining a fluoropolymer material, in some embodiments being an at least partly hydrophobic fluoropolymer material. Such a fluoropolymer material may be a porous fluoropolymer material. The method furthermore comprises depositing a metal coating using an atomic layer deposition process. The metal may be platinum. Process parameters of the atomic layer deposition process may be selected that determine a high interaction probability between the one or more precursors for the atomic layer deposition process and the fluoropolymer material. A resulting product comprising a fluoropolymer material with a metal coating deposited using atomic layer deposition also is envisaged.

The invention claimed is:

1. A method for providing a hydrophilic effect to a fluoropolymer material, the method comprising:
   obtaining an at least partly hydrophobic fluoropolymer material,
   wherein the method further comprises
      applying a plasma activation step,
      depositing an inorganic coating using an atomic layer deposition process,
   wherein said applying a plasma activation step and/or said using an atomic layer deposition process comprises controlling one or more of a number of cycles used, a precursor flow rate, a gas pressure of a gas in which the interaction occurs, a plasma exposure step, a power, a gas type or a temperature for said plasma activation step and/or said atomic layer deposition process determining an interaction probability between one or more precursors for the atomic layer deposition process and the fluoropolymer material leading in coverage of the fluoropolymer material with an inorganic material so as to obtain an inorganic coated fluoropolymer material having a contact angle with water below 30°, wherein the method further comprises, before said depositing the inorganic material, exposure to ozone of the at least partly hydrophobic fluoropolymer material.

2. A method according to claim 1, wherein obtaining an at least partly hydrophobic fluoropolymer material comprises obtaining an at least partly hydrophobic polytetrafluoroethylene (PTFE) material.

3. A method according to claim 1, wherein obtaining an at least partly hydrophobic fluoropolymer material comprises obtaining a porous fluoropolymer membrane.

4. A method according to claim 1, wherein using process parameters for said plasma activation step and/or said atomic layer deposition process determines a high interaction probability between one or more precursors for the atomic layer deposition process and the fluoropolymer material so as to obtain an inorganic coated fluoropolymer material having a contact angle with water below 10°.

5. A method according to claim 1, wherein the fluoropolymer material has at least two regions, and wherein said depositing an inorganic coating is performed only to one of said at least two regions.

6. A method according to claim 1, wherein said method comprises applying a plasma activation step performed simultaneously with said atomic layer deposition process, thus applying a plasma enhanced atomic layer deposition process.

7. A method according to claim 6, wherein applying a plasma-enhanced atomic layer deposition process comprises performing an oxygen plasma treatment step during the atomic layer deposition.

8. A method according to claim 1, wherein said using process parameters comprises applying an ozone based process during the atomic layer deposition process.

9. A method according to claim 1, wherein said using process parameters for the atomic layer deposition process comprises applying an atomic layer deposition process having a number of cycles of the atomic layer deposition leading to an inorganic oxide coated fluoropolymer material having a contact angle with water below 30°.

10. A method according to claim 1, wherein depositing an inorganic coating using an atomic layer deposition process comprises depositing an inorganic oxide coating using an atomic layer deposition process.

11. A method according to claim 10, wherein depositing an inorganic oxide coating using an atomic layer deposition process comprises depositing a metal oxide coating using an atomic layer deposition process.

* * * * *